United States Patent
Akita et al.

(10) Patent No.: US 8,363,771 B2
(45) Date of Patent: Jan. 29, 2013

(54) TRANSMISSION DEVICE, RECEIVING DEVICE AND COMMUNICATION SYSTEM

(75) Inventors: Hironobu Akita, Chiyoda-ku (JP); Seiichi Ozawa, Wako (JP); Yohei Ishizone, Chiyoda-ku (JP); Satoshi Miura, Suginami-ku (JP)

(73) Assignee: Thine Electronics, Inc., Tokyo (JP)

( * ) Notice: Subject to any disclaimer, the term of this patent is extended or adjusted under 35 U.S.C. 154(b) by 295 days.

(21) Appl. No.: 12/808,598

(22) PCT Filed: Oct. 27, 2009

(86) PCT No.: PCT/JP2009/068405
§ 371 (c)(1),
(2), (4) Date: Jun. 16, 2010

(87) PCT Pub. No.: WO2010/053021
PCT Pub. Date: May 14, 2010

(65) Prior Publication Data
US 2010/0266080 A1    Oct. 21, 2010

(30) Foreign Application Priority Data
Nov. 5, 2008 (JP) .................................. 2008-284519

(51) Int. Cl.
*H04L 7/04* (2006.01)
(52) U.S. Cl. ........ 375/362; 375/220; 375/224; 375/225; 375/354; 375/365; 375/366; 375/368; 370/509; 370/510; 327/141; 455/502
(58) Field of Classification Search .................. 375/220, 375/224, 225, 354, 362, 365, 366, 368; 370/509, 370/510; 327/141; 455/502
See application file for complete search history.

(56) References Cited

U.S. PATENT DOCUMENTS

| 5,631,925 A * | 5/1997 | Koenzen ..................... 375/225 |
| 6,760,596 B1 * | 7/2004 | Fiorini et al. .................. 455/522 |

(Continued)

FOREIGN PATENT DOCUMENTS

| EP | 1478119 A2 | 11/2004 |
| EP | 1753137 A2 | 2/2007 |

(Continued)

OTHER PUBLICATIONS

Japanese Office Action dated Feb. 21, 2012 issued by the Japanese Patent Office in corresponding Japanese Patent Application No. P2010-536739.

(Continued)

*Primary Examiner* — Leon Flores
(74) *Attorney, Agent, or Firm* — Sughrue Mion, PLLC (57) ABSTRACT

Provided are a transmission device, a receiving device, and a communication system having a simple configuration and capable of reliably executing the confirmation of a changed bit rate. The communication system 1 sends, to the receiving device 3, a serial data signal $S_{data}$ that is set as a constant value across a period of a constant multiple of a cycle of the clock when a bit rate of a serial data signal $S_{data}$ in the transmission device 2 is changed. The receiving device 3 that received the serial data signal $S_{data}$ receives training data $T_{data}$ from the transmission device 2 when it is determined that the serial data signal $S_{data}$ is a constant value across a period of a constant multiple of a cycle of the clock, and proceeds to the processing of confirming the changed bit rate.

12 Claims, 4 Drawing Sheets

U.S. PATENT DOCUMENTS

| | | | |
|---|---|---|---|
| 7,149,825 B2 * | 12/2006 | Bunker et al. | 710/60 |
| 2001/0036193 A1 | 11/2001 | Kori | |
| 2004/0258188 A1 | 12/2004 | Kim et al. | |
| 2006/0023825 A1 | 2/2006 | Kato et al. | |
| 2006/0031701 A1 * | 2/2006 | Nam et al. | 713/500 |
| 2006/0268969 A1 * | 11/2006 | Kimura et al. | 375/225 |
| 2008/0095247 A1 * | 4/2008 | Ohno et al. | 375/240.28 |
| 2008/0225933 A1 | 9/2008 | Chan et al. | |
| 2009/0122939 A1 | 5/2009 | Hoang et al. | |

FOREIGN PATENT DOCUMENTS

| | | | |
|---|---|---|---|
| JP | 60079849 A | 5/1985 | |
| JP | 61-101136 A | 5/1986 | |
| JP | 01-188060 A | 7/1989 | |
| JP | 06046073 A | 2/1994 | |
| JP | 06-291809 A | 10/1994 | |
| JP | 07162401 A | 6/1995 | |
| JP | 2001-251385 A | 9/2001 | |
| JP | 2006-050102 A | 2/2006 | |
| JP | 2006-301659 A | 11/2006 | |
| JP | 2007-043717 A | 2/2007 | |
| JP | 2008-236738 A | 10/2008 | |

OTHER PUBLICATIONS

"VESA DisplayPort Interoperability Guideline", Video Electronics Standards Association, URL:https://fs16.formsite.com/VESA/form608559305/secure_index.html, 2007-2009; p. 1-42, Version 1.1a.

International Preliminary Report on Patentability, dated Jun. 16, 2011, issued in Application No. PCT/JP2009/068405.

Office Communication issued by the Japanese Patent Office in Japanese Patent Application No. 2010-536739 dated Jun. 26, 2012.

* cited by examiner

TRANSMISSION DEVICE, RECEIVING DEVICE AND COMMUNICATION SYSTEM

TECHNICAL FIELD

The present invention relates to a transmission device, a receiving device, and a communication system having the foregoing devices.

BACKGROUND ART

Conventionally, clock data recovery (CDR: Clock Data Recovery) technology is known. With this CDR technology, in a system where a unidirectional high-speed serial signal line and a low-speed control signal line are provided between the transmission device and the receiving device, a serial data signal embedded with a clock is sent from the transmission device via the high-speed serial signal line, and the receiving device restores the data and clock based on the serial data signal. Subsequently, the system reproduces the recovered clock (recovery clock), compares the phase of the edge of the data and clock to adjust the phase, and thereby acquires accurate data.

Meanwhile, if the bit rate of the serial data signal that is sent from the transmission device is changed, an abnormal clock is reproduced in the receiving device, and erroneous data may be acquired. In order to overcome the foregoing problem, the receiving device implements processing for confirming the changed bit rate that is sent from the transmission device, and the transmission device sends a serial data signal including the changed bit rate to the receiving device after the foregoing processing.

In order to implement the foregoing processing, it is necessary to transfer a command such as a bit rate change notice or the like between the transmission device and the receiving device. Thus, for instance, the display port described in Non-Patent Document 1 is provided with a high-speed serial signal line, and a low-speed control signal line capable of interactive communication. The display port described in Cited Document 1 is able to transfer a command for confirming the bit rate with the interactive communication control signal line.

PRIOR ART DOCUMENTS

Non-Patent Document

Non-Patent Document 1: "VESA Display Port Standard", FIG. 1-1, FIG. 3-10, [online], Jan. 11, 2008, Video Electronics Standards Association, [Searched on Nov. 4, 2008], Internet <URL: https://fs16.formsite.com./VESA/form608559305/secure_index.html>

DESCRIPTION OF THE INVENTION

Problems to be Solved by the Invention

Nevertheless, with the foregoing conventional technology, a control circuit is required to enable the interactive communication, and, in addition to the size of the circuit becoming enlarged, there is a problem in that a complicated protocol must be set in order to prevent the signals (commands) sent from the transmission device and the receiving device from colliding on the transmission line. Meanwhile, although there is also a configuration of separately providing two control signal lines for the respective directions; namely, from the transmission device to the receiving device and from the receiving device to the transmission device, the increase in the number of control signal lines is undesirable from the perspective of increase in costs and power consumption.

The present invention was devised in order to overcome the foregoing problems. Thus, an object of this invention is to provide a transmission device, a receiving device, and a communication system having a simple configuration and capable of reliably executing the confirmation of the changed bit rate.

Means for Solving the Problem

The communication system of the present invention is characterized in that it comprises the following transmission device and receiving device. Specifically, the transmission device of the present invention comprises: a signal transmission unit for sending a serial data signal embedded with a clock to a receiving device; a change notice transmission command unit for outputting to the signal transmission unit a control signal for sending by the signal transmission unit to the receiving device a serial data signal that is set as a constant value across a period of a constant multiple of a cycle of the clock when a bit rate of a serial data signal to be sent by the signal transmission unit is changed; and a training data creation unit for creating training data for confirming the changed bit rate in the receiving device after the control signal is output from the change notice transmission command unit, and causing the signal transmission unit to send the training data to the receiving device.

In addition, the receiving device of the present invention comprises: a signal receiving unit for receiving a serial data signal embedded with a clock from a transmission device, a received signal constant value determination unit for determining whether the serial data signal received by the signal receiving unit is a constant value across a period of a constant multiple of a cycle of the clock; and a clock recovery unit for receiving training data to be used for confirming the changed bit rate from the transmission device and confirming the changed bit rate when the received signal constant value determination unit determines that the serial data signal is a constant value.

The communication system comprising the foregoing transmission device and receiving device sends, to the receiving device, a serial data signal that is set as a constant value across a period of a constant multiple of a cycle of the clock when a bit rate of a serial data signal to be sent from the signal transmission unit is to be changed. The receiving device that received the serial data signal receives training data from the transmission device if it is determined that the serial data signal is a constant value across a period of a constant multiple of a cycle of the clock, and proceeds to the processing of confirming the changed bit rate. Accordingly, the receiving device is able to recognize the change of the bit rate by receiving the serial data signal and proceed to the processing for confirming the changed bit rate without having to receive a signal from the transmission device indicating that the bit rate will be changed. Thus, the confirmation of the changed bit rate can be reliably executed with a simple conventional configuration without having to increase the control signal line or enabling interactive communication.

Moreover, the communication system of the present invention is characterized in that it comprises the following transmission device and receiving device. Specifically, the transmission device of the present invention further comprises a training start determination unit for receiving, from the receiving device, and inputting a training start request signal indicating that the training data for confirming the changed bit rate is requested from the receiving device, wherein, when the training start determination unit receives the training start request signal from the receiving device, the training data creation unit causes the signal transmission unit to send the training data to the receiving device.

In addition, the receiving device of the present invention further comprises a training start signal request unit for sending a training start request signal for requesting training data to be used for confirming the changed bit rate and requesting of the transmission device the training data when the received signal constant value determination unit determines that the serial data signal is a constant value across a period of a constant multiple of a cycle of the clock.

With the communication system comprising the foregoing transmission device and receiving device, the receiving device sends a training start request signal to the transmission device upon determining that the serial data signal is a constant value; that is, upon confirming that the bit rate has been changed, and the transmission device receives the training start request signal and subsequently sends training data to the receiving device. Consequently, the transmission device will send the training data to the receiving device after the receiving device reliably recognizes the change of the bit rate. Accordingly, it is possible to prevent the transmission device from erroneously sending the training data or data of the changed bit rate before the receiving device recognizes the change of the bit rate.

Further, the communication system of the present invention is characterized in that it comprises the following transmission device and receiving device. Specifically, when the training start determination unit receives a training end signal indicating that the confirmation of the changed bit rate is complete from the receiving device, the signal transmission unit included in the transmission device of the present invention sends a serial data signal of the changed bit rate to the receiving device.

Moreover, the training start signal request unit included in the receiving device of the present invention inputs an end notice signal indicating that the confirmation of the changed bit rate that is output from the clock recovery unit is complete, sends a training end signal to the transmission device according to the end notice signal, and thereby notifies the transmission device that the confirmation of the changed bit rate is complete.

With the communication system comprising the foregoing transmission device and receiving device, the receiving device sends a training end signal to the transmission device indicating that the confirmation of the bit rate is complete, and the transmission device sends the serial data signal of the changed bit rate after receiving the foregoing training end signal. Accordingly, it is possible to prevent the transmission device from erroneously sending a serial data signal of the changed bit rate to the receiving device before the confirmation of the bit rate is complete.

Moreover, the transmission device of the present invention further comprises a bit rate determination unit for inputting a parallel data signal and determining whether there is any change in the bit rate of the parallel data signal, and outputting bit rate change information to the change notice transmission command unit upon determining that the bit rate of the parallel data signal has changed, wherein, the change notice transmission command unit, upon receiving the bit rate change information from the bit rate determination unit, outputs the control signal to the signal transmission unit.

Moreover, with the transmission device of the present invention, the bit rate determination unit can be configured as a phase locked loop (PLL). In the foregoing case, a lock signal of the phase locked loop is preferably used as the bit rate change information.

Effect of the Invention

According to the present invention, the confirmation of the changed bit rate can be reliably executed with a simple configuration.

BEST MODE FOR CARRYING OUT THE INVENTION

The best mode for carrying out the present invention is now explained in detail with reference to the attached drawings.

Incidentally, the same components in the explanation of the drawings are given the same reference numerals, and the redundant explanation thereof is omitted.

Figure 1:
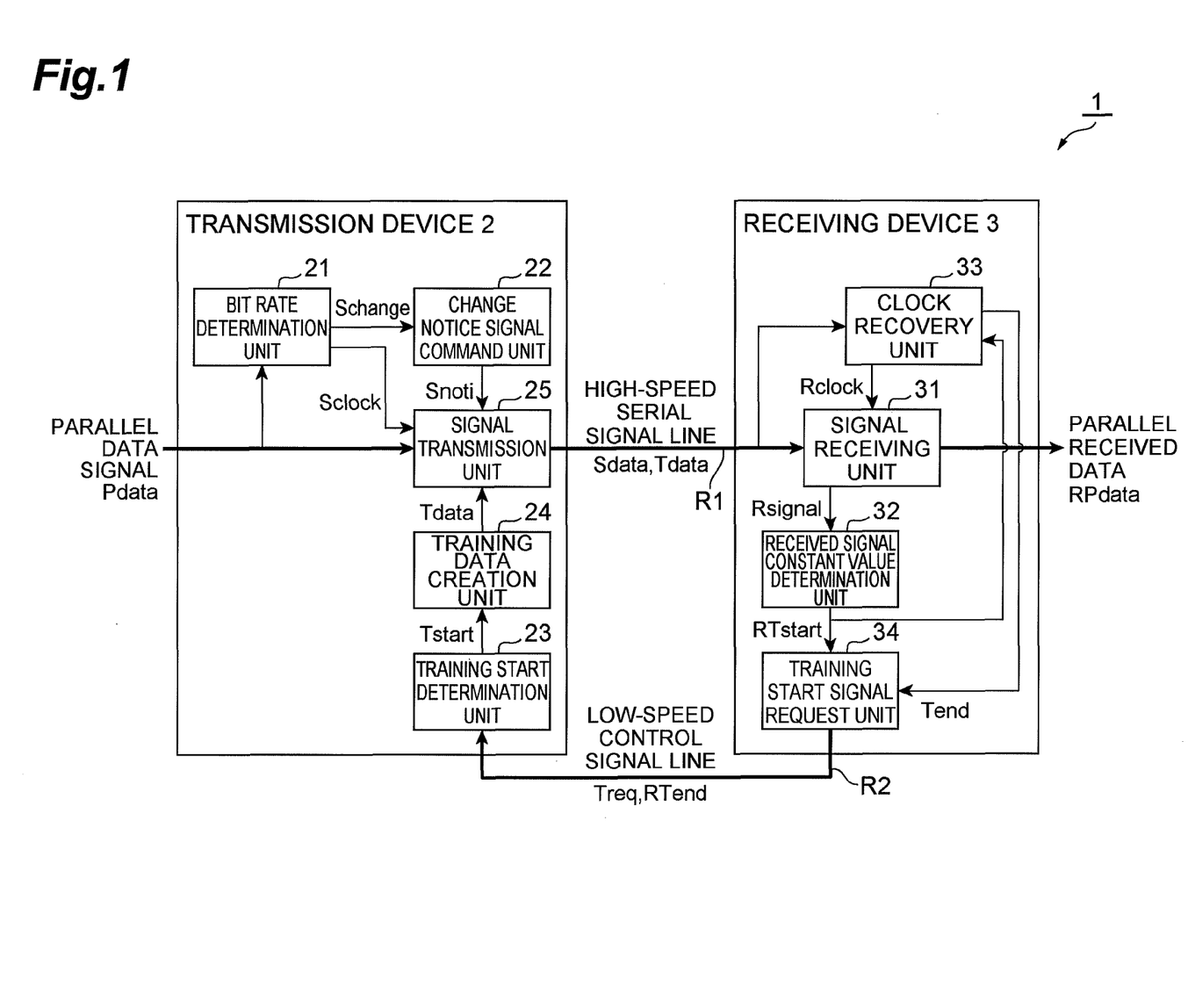
FIG. 1 is a configuration diagram of the communication system according to the present embodiment.

FIG. 1 is a configuration diagram of the communication system according to the present embodiment. The communication system 1 shown in this figure comprises a transmission device 2 and a receiving device 3. The transmission device 2 and the receiving device 3 are connected via a high-speed serial signal line R1, and a control signal line R2 of a lower speed than the high-speed serial signal line R1. The high-speed serial signal line R1 is a signal line for transmitting signals sent from the transmission device 2 to the receiving device 3. The low-speed control signal line R2 is a signal line for transmitting signals sent from the receiving device 3 to the transmission device 2.

The transmission device 2 comprises a bit rate determination unit 21, a change notice signal command unit 22, a training start determination unit 23, a training data creation unit 24, and a signal transmission unit 25. The transmission device 2 is a device for sending, for example, image (video) data to the receiving device 3.

The bit rate determination unit 21 inputs a parallel data signal $P_{data}$ that was input into the transmission device 2 to determine the bit rate of the parallel data signal $P_{data}$, and outputs bit rate information $S_{clock}$ related to the bit rate to the signal transmission unit 25. The bit rate determination unit 21 determines whether there is any change in the bit rate of the parallel data signal $P_{data}$ and, upon data determining that the bit rate of the parallel data signal $P_{data}$ has changed, outputs the bit rate change information $S_{change}$ to the change notice signal command unit 22. The parallel data signal $P_{data}$ is input into the transmission device 2 via a signal line (parallel bus) that is configured from a plurality of signal lines, and the data to be sent in a single signal line is not limited to 1 bit per clock, and it may be a plurality of bits per clock.

The change notice signal command unit 22 inputs the bit rate change information $S_{change}$ that was output from the bit rate determination unit 21, and outputs to the signal transmission unit 25 a control signal $S_{noti}$ for controlling the serial data signal $S_{data}$ to be sent to the receiving device 3 to be a constant value across a period of a constant multiple of a cycle of the clock.

The training start determination unit 23 receives from the receiving device 3 and inputs a training start request signal $T_{req}$ that was sent via the control signal line R2, determines that training is to be started according to the training start request signal $T_{req}$, and outputs the training start signal $T_{start}$ to the training data creation unit 24. The training start determination unit 23 receives from the receiving device 3 and inputs a training end signal $RT_{end}$ that was sent via the control signal line R2, and outputs the training end signal $RT_{end}$ to the signal transmission unit 25 via the training data creation unit 24. The training will be described later.

The training data creation unit 24 inputs the training start signal $T_{start}$ that was output from the training start determination unit 23, and outputs training data $T_{data}$ to be used in the training to the signal transmission unit 25 in accordance with the training start signal $T_{start}$. The training data $T_{data}$ to be used in the training is more specifically a signal corresponding to the bit rate, and is data (training pattern) in which, for instance, "1" and "0" are in a series such as "1010 . . . ."

The signal transmission unit 25 inputs a parallel data signal $P_{data}$ that was input into the transmission device 2, converts the parallel data signal $P_{data}$ into a serial data signal $S_{data}$ according to the bit rate information $S_{clock}$ that was output from the bit rate determination unit 21 and sends it to the receiving device 3 via the high-speed serial signal line R1. Moreover, the signal transmission unit 25 inputs a control signal $S_{noti}$ that was output from the change notice signal command unit 22, creates a serial data signal $S_{data}$ for setting a constant value across a period of a constant multiple of a cycle of the clock according to the control signal $S_{noti}$, and sends this to the receiving device 3 via the high-speed serial signal line R1. Specifically, the signal transmission unit 25 sets the serial data signal $S_{data}$ so that it will be a low level across a constant multiple of a cycle of the clock. The period of the constant multiple is suitably set according to the system to be configured and, for example, if the maximum period of the low level of the serial data signal is set to 6 cycles of the clock, it is set to approximately several times of such 6 cycles.

Moreover, the signal transmission unit 25 stops the transmission of the serial data signal $S_{data}$ by inputting the training data $T_{data}$ that was output from the training data creation unit 24, and sends the training data $T_{data}$ to the receiving device 3 via the high-speed serial signal line R1. Further, when the signal transmission unit 25 inputs, via the training data creation unit 24, the training end signal $RT_{end}$ that was output from the training start determination unit 23, it stops the transmission of the training data $T_{data}$ and resumes the transmission of the serial data signal $S_{data}$.

The receiving device 3 is configured by including a signal receiving unit 31, a received signal constant value determination unit 32, a clock recovery unit 33, and a training start signal request unit 34. The receiving unit 3 receives image data from the transmission unit 2 and outputs such image data. The receiving unit 3 configures a part of, for instance, an LCD (Liquid Crystal Display) panel.

The signal receiving unit 31 receives and inputs the serial data signal $S_{data}$ that was sent from the transmission device 2 via the high-speed serial signal line R1, and creates received parallel data $RP_{data}$ upon acquiring, from the serial data signal $S_{data}$, data based on the recovery clock $R_{clock}$ (described later) that is output from the clock recovery unit 33. Specifically, the signal receiving unit 31 acquires accurate data from the serial data signal $S_{data}$ using a clock indicated by the recovery clock $R_{clock}$, and creates the acquired data and clock as the received parallel $RP_{data}$. The received parallel data $RP_{data}$ is output, for instance, as image data to the display unit of an LCD. Moreover, the signal receiving unit 31 outputs the input serial data signal $S_{data}$ as the determination signal $R_{signal}$ to the received signal constant value determination unit 32.

The received signal constant value determination unit 32 inputs the determination signal $R_{signal}$ that was output from the signal receiving unit 31, and determines, based on the determination signal $R_{signal}$, whether the serial data signal $S_{data}$ is a constant value across a period of a multiple constant of a cycle of the clock. If the received signal constant value determination unit 32 determines that the serial data signal $S_{data}$ is a constant value, it outputs the training start signal $RT_{start}$ to the clock recovery unit 33 and the training start signal request unit 34.

Figure 2:
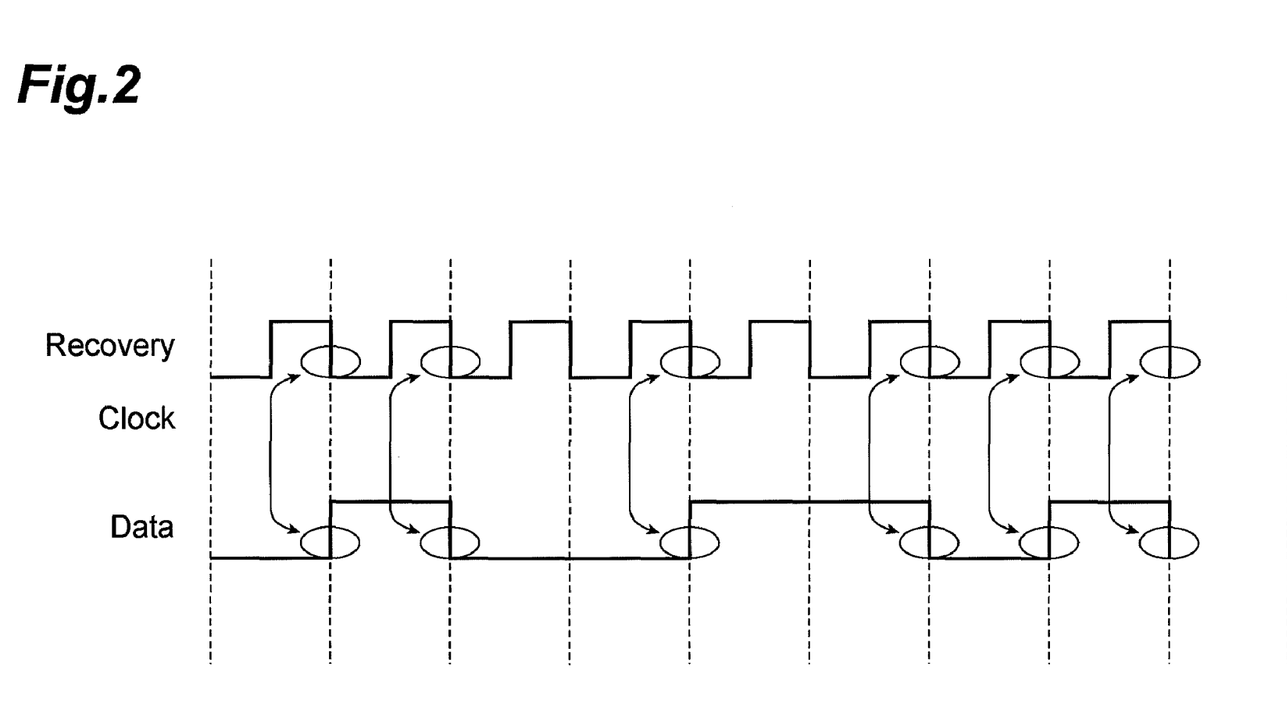
FIG. 2 is a timing chart showing an example of the restoration of data and clock.

The clock recovery unit 33 receives from the transmission device 2 and inputs the serial data signal $S_{data}$ embedded with a clock which was sent via the high-speed serial signal line R1, and restores and reproduces the recovery clock $R_{clock}$ from the input serial data signal $S_{data}$. This is now explained in detail with reference to FIG. 2. FIG. 2 is a timing chart showing an example of the restoration of the data and clock. As shown in FIG. 2, the clock recovery unit 34 reproduces the same clock frequency as the data bit rate by comparing the phase of the edge of the restored recovery clock (indicated with arrows in this figure) and the edge of the data, and thereby adjusting the phase. The recovery clock $R_{clock}$ is used as a sampling clock since it creates a received parallel signal $RP_{data}$ from the serial data signal $S_{data}$ in the signal receiving unit 31.

Moreover, if a training start signal $RT_{start}$ is output from the received signal constant value determination unit 32, the clock recovery unit 33 inputs the training start signal $RT_{start}$ and switches to the training mode. The clock recovery unit 33 receives from the transmission device 2 and inputs the training data $T_{data}$ that was sent via the high-speed serial signal line R1, and implements the training based on the training data $T_{data}$. Training refers to the learning process for dealing with the serial data signal $S_{data}$ of the changed bit rate by recognizing the training pattern (for example, "1010 . . . ") that is represented in the training data $T_{data}$. When the training is complete, the clock recovery unit 33 outputs an end notice signal $T_{end}$ indicating that the training is complete to the training start signal request unit 34.

The training start signal request unit 34 inputs the training start signal $RT_{start}$ that was output from the received signal constant value determination unit 32, and outputs the training start request signal $T_{req}$ to the transmission device 2 via the control signal line R2 in accordance with the training start signal $RT_{start}$. Moreover, the training start signal request unit 34 inputs the end notice signal $T_{end}$ that was output from the clock recovery unit 33, and sends the training end signal $RT_{end}$ to the transmission device 2 via the control signal line R2 in accordance with the end notice signal $T_{end}$.

Figure 3:
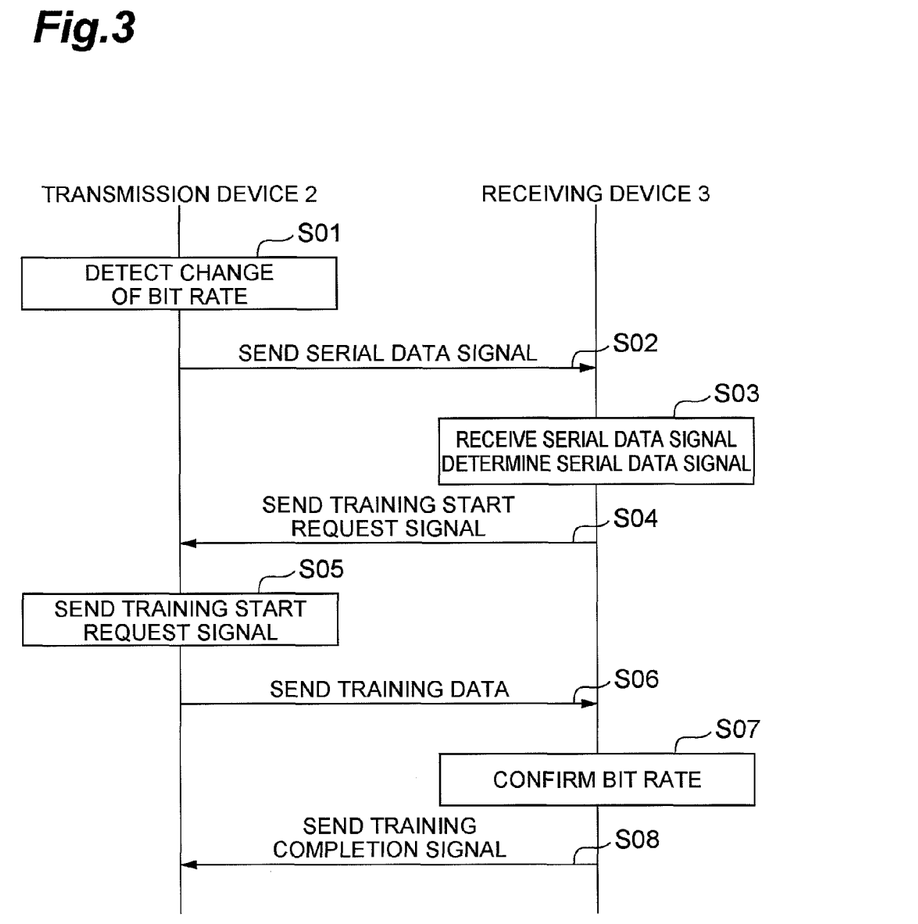
FIG. 3 is a sequence diagram showing the processing to be performed by the communication system.

The processing to be performed by the communication system 1 including the transmission device 2 and the receiving device 3 configured as described above is now explained. FIG. 3 is a sequence diagram showing the processing of the communication system.

In FIG. 3, foremost, the bit rate determination unit 21 detects the change in the bit rate of the serial data signal $S_{data}$ to be sent from the signal transmission unit 25 of the transmission device 2 (S01). Then, when the bit rate is changed, the signal transmission unit 25 sends a serial data signal $S_{data}$ which is set to be a constant value across a period of a constant multiple of a cycle of the clock to the receiving device 3 (S02).

Subsequently, the signal receiving unit 31 of the receiving device 3 receives the serial data signal $S_{data}$, and the received signal constant value determination unit 32 determines, based on the received serial data signal $S_{data}$, whether the serial data signal $S_{data}$ is a constant value across a period of a constant multiple of a cycle of the clock (S03).

If it is determined that the serial data signal $S_{data}$ is a constant value, the training start signal request unit 34 sends to the transmission device 2 a training start request signal $T_{req}$ for requesting training data $T_{data}$ to be used in confirming the changed bit rate (S04).

The training start determination unit 23 of the transmission device 2 receives the training start request signal $T_{req}$ that was sent from the receiving device 3 (S05), and the signal transmission unit 25 sends the training data $T_{data}$ to the receiving device 3 in accordance with the training start request signal $T_{req}$ (S06). Subsequently, the clock recovery unit 33 of the receiving device 3 receives the training data $T_{data}$ that was sent from the transmission device 2, and the confirmation of the bit rate is thereby implemented (S07). After the training by the clock recovery unit 33 is complete, the training start signal request unit 34 sends a training end signal $RT_{end}$ to the transmission device 2 (S08).

Accordingly, the communication system 1 including the transmission device 2 and the receiving device 3 of the present embodiment sends, to the receiving device 3, a serial data signal $S_{data}$ that is set as a constant value across a period of a constant multiple of a cycle of the clock when a bit rate of a serial data signal $S_{data}$ is to be changed in the transmission device 2. Then, the receiving device 3 that received the serial data signal $S_{data}$ receives training data $T_{data}$ from the transmission device 2 if it is determined that the serial data signal $S_{data}$ is a constant value across a period of a constant multiple of a cycle of the clock, and proceeds to the processing of confirming the changed bit rate. Accordingly, the receiving device 3 is able to recognize the change of the bit rate by receiving the serial data signal $S_{data}$ and proceed to the processing for confirming the changed bit rate without having to receive, via a different path, a signal from the transmission device 2 indicating that the bit rate will be changed. Thus, the confirmation of the changed bit rate can be reliably executed with a simple conventional configuration without having to increase the control signal line or enabling interactive communication.

Moreover, the receiving device 3 sends a training start request signal $T_{req}$ to the transmission device 2 upon determining that the serial data signal $S_{data}$ is a constant value; that is, upon confirming that the bit rate has been changed, and the transmission device 2 receives the training start request signal $T_{req}$ and subsequently sends training data $T_{data}$ to the receiving device 3. Consequently, the transmission device 2 will send the training data $T_{data}$ to the receiving device 3 after the receiving device 3 reliably recognizes the change of the bit rate. Accordingly, it is possible to prevent the transmission device 2 from erroneously sending the training data $T_{data}$ or data of the changed bit rate before the receiving device 3 recognizes the change of the bit rate.

Further, the receiving device 3 sends a training end signal $RT_{end}$ to the transmission device 2 indicating that the confirmation of the bit rate is complete, and the transmission device 2 sends the serial data signal $S_{data}$ of the changed bit rate after receiving the foregoing training end signal $RT_{end}$. Accordingly, it is possible to prevent the transmission device 2 from erroneously sending a serial data signal $S_{data}$ of the changed bit rate to the receiving device 3 before the confirmation of the bit rate is complete.

Incidentally, the present invention is not limited to the foregoing embodiment. For example, in the foregoing embodiment, although the bit rate determination unit 21 detected the bit rate change and determined the changed in the bit rate, the transmission device 2 may detect the change in the bit rate by receiving a notice indicating that the bit rate will be changed.

In addition, in the foregoing embodiment, the bit rate determination unit 21 may be configured as a PLL (Phase Locked Loop). In the foregoing case, as a result of using the lock determination function of the PLL, the lock signal of the PLL can be used as the bit rate change information. With the PLL, if the bit rate of the input parallel data signal $P_{data}$ is changed, it becomes an unlocked state. The detection of an unlocked state in the PLL is publicly known, and the detailed explanation thereof is omitted, but an example is described below. A phase detector (PD: Phase Detector) in the PLL compares the phase of the block embedded in the input parallel data signal $P_{data}$ and the clock that is output from a VCO (Voltage Controlled Oscillator), and detects an unlocked state and determines that the data rate has been changed, for instance, when a high level state or low level state in the clock embedded in the parallel data signal $P_{data}$ continues or when only the clock that was output from the VCO is input. If the phase detector determines that the bit rate of the parallel data signal $P_{data}$ has changed (detects an unlocked state), it outputs the bit rate change information $S_{change}$ to the change notice signal command unit 22.

Moreover, as the serial data $S_{data}$ of the constant value to be sent by the transmission device 2, in addition to the state of 0 and 1 as the transmission state of normal data, a state where the differential signal pair is of the same potential, a state where they are both of high impedance, and a state where the common voltage is considerably different will also be recognized by the receiving device 3 as a change in resolution, and can be applied as an embodiment of the present invention. Moreover, if the serial data $S_{data}$ of the constant value is sent for a given period of time, and it is known in advance that the receiving device 3 will reliably output $RT_{start}$, the transmission device 2 may output $T_{data}$ before receiving $T_{req}$ after sending the serial data $S_{data}$ of the constant value for a given period of time.

Figure 4:
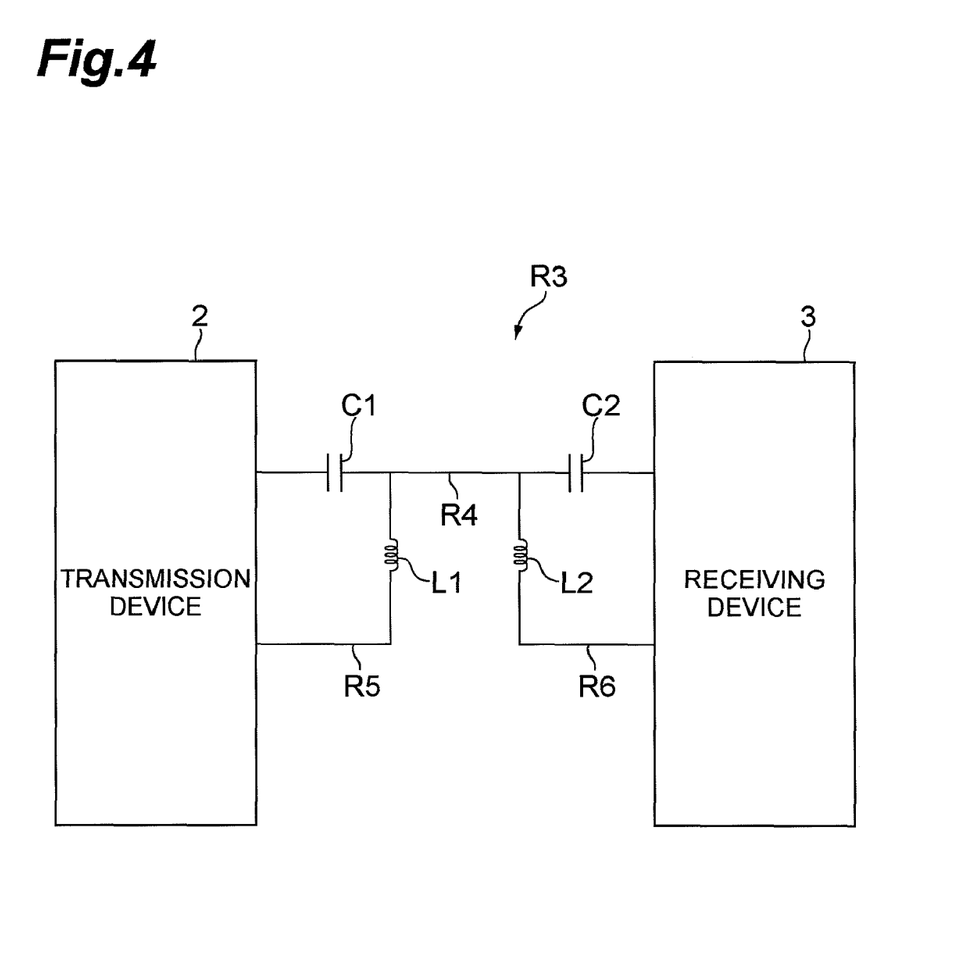
FIG. 4 is a diagram showing the configuration of the signal line according to a modified example.

Moreover, in the foregoing embodiment, although the transmission device 2 and the receiving device 3 are connected via the high-speed serial signal line R1 and the low-speed control signal line R2, the configuration may also be, for instance, as shown in FIG. 4. With the signal line R3 shown in FIG. 4, two capacities; namely, capacity C1 and capacity C2 are connected in series on the first signal line R4. In addition, one end of the second signal line R5 to be connected to the transmission device 2 and one end of the second signal line R6 to be connected to the receiving device 3 are connected between the capacity C1 and the capacity C2 of the first signal line L4. An inductor L1 is connected in series on the second signal line R5. Moreover, an inductor L2 is connected in series on the second signal line R6. According to this kind of configuration, the serial data signal $S_{data}$ can be sent from the transmission device 3 to the receiving device 4 and control signals and the like can be sent from the receiving device 3 to the transmission device 2 using one signal line R3. Resistive elements may also be connected in substitute for the inductors L1, L2.

In addition, although the foregoing embodiment is based on wire communication, it may also be applied to wireless communication.

EXPLANATION OF REFERENCE NUMERALS

1 . . . communication system, 2 . . . transmission device, 3 . . . receiving device, 21 . . . bit rate determination unit, 22 . . . change notice signal command unit (change notice transmission command unit), 23 . . . training start determination unit, 24 . . . training data creation unit, 25 . . . signal transmission unit, 31 . . . signal receiving unit, 32 . . . received signal constant value determination unit, 33 . . . clock recovery unit, 34 . . . training start signal request unit, $S_{data}$ . . . serial data signal, $S_{noti}$ . . . control signal, $T_{data}$ . . . training data, $T_{req}$ . . . training start request signal, $T_{end}$ . . . end notice signal, $RT_{end}$ . . . training end signal.

The invention claimed is:

1. A transmission device, comprising:
   a signal transmission unit for sending a serial data signal embedded with a clock to a receiving device;
   a change notice transmission command unit for outputting to the signal transmission unit a control signal for sending by the signal transmission unit to the receiving device a serial data signal that is set as a constant value across a period of a constant multiple of a cycle of the clock when a bit rate of a serial data signal to be sent by the signal transmission unit is changed; and
   a training data creation unit for creating training data for confirming the changed bit rate in the receiving device after the control signal is output from the change notice transmission command unit, and causing the signal transmission unit to send the training data to the receiving device.

2. The transmission device according to claim 1, further comprising a training start determination unit for receiving, from the receiving device, and inputting a training start request signal indicating that the training data for confirming the changed bit rate is requested from the receiving device,
   wherein, when the training start determination unit receives the training start request signal from the receiving device, the training data creation unit causes the signal transmission unit to send the training data to the receiving device.

3. The transmission device according to claim 2, wherein, when the training start determination unit receives a training end signal indicating that confirmation of the changed bit rate is complete from the receiving device, the signal transmission unit sends a serial data signal of the changed bit rate to the receiving device.

4. The transmission device according to claim 1, further comprising a bit rate determination unit for inputting a parallel data signal and determining whether there is any change in the bit rate of the parallel data signal, and outputting bit rate change information to the change notice transmission command unit upon determining that the bit rate of the parallel data signal has changed,
   wherein, the change notice transmission command unit, upon receiving the bit rate change information from the bit rate determination unit, outputs the control signal to the signal transmission unit.

5. The transmission device according to claim 4, wherein the bit rate determination unit is configured in a phase locked loop (PLL).

6. The transmission device according to claim 5, where a lock signal of the phase locked loop is used as the bit rate change information.

7. A receiving device, comprising:
   a signal receiving unit for receiving a serial data signal embedded with a clock from a transmission device;
   a received signal constant value determination unit for determining whether the serial data signal received by the signal receiving unit is a constant value across a period of a constant multiple of a cycle of the clock; and
   a clock recovery unit for receiving training data to be used for confirming the changed bit rate from the transmission device and confirming the changed bit rate when the received signal constant value determination unit determines that the serial data signal is a constant value.

8. The receiving device according to claim 7, further comprising a training start signal request unit for sending a training start request signal for requesting training data to be used for confirming the changed bit rate and requesting of the transmission device the training data when the received signal constant value determination unit determines that the serial data signal is a constant value across a period of a constant multiple of a cycle of the clock.

9. The receiving device according to claim 8, wherein the training start signal request unit inputs an end notice signal indicating that the confirmation of the changed bit rate that is output from the clock recovery unit is complete, sends a training end signal to the transmission device according to the end notice signal, and thereby notifies the transmission device that the confirmation of the changed bit rate is complete.

10. A communication system, comprising:
    a transmission device, comprising:
    a signal transmission unit for sending a serial data signal embedded with a clock to a receiving device;
    a change notice transmission command unit for outputting to the signal transmission unit a control signal for sending by the signal transmission unit to the receiving device a serial data signal that is set as a constant value across a period of a constant multiple of a cycle of the clock when a bit rate of a serial data signal to be sent by the signal transmission unit is changed; and
    a training data creation unit for creating training data for confirming the changed bit rate in the receiving device after the control signal is output from the change notice transmission command unit, and causing the signal transmission unit to send the training data to the receiving device; and
    a receiving device, comprising:
    a signal receiving unit for receiving a serial data signal embedded with a clock from a transmission device;
    a received signal constant value determination unit for determining whether the serial data signal received by the signal receiving unit is a constant value across a period of a constant multiple of a cycle of the clock; and
    a clock recovery unit for receiving training data to be used for confirming the changed bit rate from the transmission device and confirming the changed bit rate when the received signal constant value determination unit determines that the serial data signal is a constant value.

11. A communication system, comprising:
    a transmission device, comprising:
    a signal transmission unit for sending a serial data signal embedded with a clock to a receiving device;
    a change notice transmission command unit for outputting to the signal transmission unit a control signal for sending by the signal transmission unit to the receiving device a serial data signal that is set as a constant value across a period of a constant multiple of a cycle of the clock when a bit rate of a serial data signal to be sent by the signal transmission unit is changed;
    a training data creation unit for creating training data for confirming the changed bit rate in the receiving device after the control signal is output from the change notice transmission command unit, and causing the signal transmission unit to send the training data to the receiving device; and
    a training start determination unit for receiving, from the receiving device, and inputting a training start request signal indicating that the training data for confirming the changed bit rate is requested from the receiving device,
    wherein, when the training start determination unit receives the training start request signal from the receiving device, the training data creation unit causes the signal transmission unit to send the training data to the receiving device; and a receiving device, comprising:

a signal receiving unit for receiving a serial data signal embedded with a clock from a transmission device;

a received signal constant value determination unit for determining whether the serial data signal received by the signal receiving unit is a constant value across a period of a constant multiple of a cycle of the clock, a clock recovery unit for receiving training data to be used for confirming the changed bit rate from the transmission device and confirming the changed bit rate when the received signal constant value determination unit determines that the serial data signal is a constant value; and a training start signal request unit for sending a training start request signal for requesting training data to be used for confirming the changed bit rate and requesting of the transmission device the training data when the received signal constant value determination unit determines that the serial data signal is a constant value across a period of a constant multiple of a cycle of the clock.

12. A communication system, comprising:

a transmission device, comprising:

a signal transmission unit for sending a serial data signal embedded with a clock to a receiving device;

a change notice transmission command unit for outputting to the signal transmission unit a control signal for sending by the signal transmission unit to the receiving device a serial data signal that is set as a constant value across a period of a constant multiple of a cycle of the clock when a bit rate of a serial data signal to be sent by the signal transmission unit is changed;

a training data creation unit for creating training data for confirming the changed bit rate in the receiving device after the control signal is output from the change notice transmission command unit, and causing the signal transmission unit to send the training data to the receiving device; and a training start determination unit for receiving, from the receiving device, and inputting a training start request signal indicating that the training data for confirming the changed bit rate is requested from the receiving device, wherein, when the training start determination unit receives the training start request signal from the receiving device, the training data creation unit causes the signal transmission unit to send the training data to the receiving device, and wherein, when the training start determination unit receives a training end signal indicating that confirmation of the changed bit rate is complete from the receiving device, the signal transmission unit sends a serial data signal of the changed bit rate to the receiving device; and a receiving device, comprising:

a signal receiving unit for receiving a serial data signal embedded with a clock from a transmission device;

a received signal constant value determination unit for determining whether the serial data signal received by the signal receiving unit is a constant value across a period of a constant multiple of a cycle of the clock;

a clock recovery unit for receiving training data to be used for confirming the changed bit rate from the transmission device and confirming the changed bit rate when the received signal constant value determination unit determines that the serial data signal is a constant value; and a training start signal request unit for sending a training start request signal for requesting training data to be used for confirming the changed bit rate and requesting of the transmission device the training data when the received signal constant value determination unit determines that the serial data signal is a constant value across a period of a constant multiple of a cycle of the clock;

wherein the training start signal request unit inputs an end notice signal indicating that the confirmation of the changed bit rate that is output from the clock recovery unit is complete, sends a training end signal to the transmission device according to the end notice signal, and thereby notifies the transmission device that the confirmation of the changed bit rate is complete.

* * * * *